(12) United States Patent
Wang

(10) Patent No.: US 11,322,078 B1
(45) Date of Patent: May 3, 2022

(54) DISPLAY SUBSTRATE, HIGH-PRECISION METAL MASK, DISPLAY DEVICE AND DISPLAY DRIVING METHOD

(71) Applicant: BOE Technology Group Co., Ltd., Beijing (CN)

(72) Inventor: Yanyan Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/352,316

(22) Filed: Jun. 20, 2021

(30) Foreign Application Priority Data

Nov. 27, 2020 (CN) .......................... 202011354581.0

(51) Int. Cl.
  *G09G 3/30* (2006.01)
  *G09G 3/3208* (2016.01)
  *H01L 27/32* (2006.01)
  *H01L 51/00* (2006.01)

(52) U.S. Cl.
  CPC ....... *G09G 3/3208* (2013.01); *H01L 27/3213* (2013.01); *H01L 27/3216* (2013.01); *H01L 27/3218* (2013.01); *G09G 2300/0452* (2013.01); *G09G 2360/145* (2013.01); *H01L 51/0011* (2013.01)

(58) Field of Classification Search
  CPC ......... G09G 3/3208; G09G 2300/0452; G09G 2360/145; G09G 3/32; G09G 3/30; G09G 3/34; H01L 27/3213; H01L 27/3216; H01L 27/3218; H01L 51/0011
  See application file for complete search history.

(56) References Cited

U.S. PATENT DOCUMENTS

| | | | |
|---|---|---|---|
| 2010/0079611 A1* | 4/2010 | Suzuki | H04N 5/369 348/222.1 |
| 2018/0165533 A1* | 6/2018 | Cho | G06K 9/0004 |
| 2019/0326364 A1* | 10/2019 | Chai | H01L 27/3288 |
| 2020/0357335 A1* | 11/2020 | Yu | G09G 3/3225 |
| 2020/0411607 A1* | 12/2020 | Jian | H01L 27/3218 |
| 2021/0090497 A1* | 3/2021 | Tang | G09G 3/3225 |

\* cited by examiner

*Primary Examiner* — Pegeman Karimi
(74) *Attorney, Agent, or Firm* — IPRO, PLLC

(57) ABSTRACT

A display substrate, a high-precision metal mask, a display device and a display driving method are provided in the present disclosure. A plurality of pixel repetition units is included in a display region of the display substrate, each pixel repetition unit includes two first sub-pixels, one second sub-pixel and one third sub-pixel, one of the two first sub-pixels is located in a first row, and the other of the two first sub-pixels is located in a third row, the second sub-pixel and the third sub-pixel are arranged in a same second row. A distribution density of the pixel repetition units in the first region is smaller than a distribution density of the pixel repetition units in the second region.

20 Claims, 2 Drawing Sheets

DISPLAY SUBSTRATE, HIGH-PRECISION METAL MASK, DISPLAY DEVICE AND DISPLAY DRIVING METHOD

CROSS-REFERENCE TO RELATED APPLICATIONS

The present application claims priority to Chinese Patent Application No. 202011354581.0 filed in China on Nov. 27, 2020 which is incorporated herein by reference in its entirety.

TECHNICAL FIELD

The present disclosure relates to the field of display technology, in particular to a display substrate, a high-precision metal mask, a display device and a display driving method.

BACKGROUND

Full screen is one of the important development trends in a display panel in recent years. For a full-screen display product (e.g., mobile phone), a screen is provided at its entire front surface, and a bezel-free design is adopted to acquire a screen-to-body ratio of approximately 100%. When the mobile phone is provided with a full screen, it is able to improve an appearance and a sense of science and technology of the entire mobile phone. In addition, the mobile phone is provided with a larger screen to significantly improve the visual experience.

SUMMARY

A display substrate is provided, including a display region. The display region includes a first region and a second region surrounding the first region, and an optical element is provided at a non-display side of the first region. A plurality of pixel repetition units is included in the display region, each pixel repetition unit includes four sub-pixels distributed in three adjacent rows and including two first sub-pixels, one second sub-pixel and one third sub-pixel, one of the two first sub-pixels is located in a first row and the other of the two first sub-pixels is located in a third row, the second sub-pixel and the third sub-pixel are arranged in a same row, and are located in a second row between the first row and the third row, and the first row, the second row and the third row each extend in a first direction and are arranged in a second direction crossing the first direction. The first sub-pixel in the first row, the second sub-pixel and the third sub-pixel in the second row form one pixel capable of emitting white light, and the first sub-pixel in the third row, the second sub-pixel and the third sub-pixel in the second row form another pixel capable of emitting white light. Multiple pixel repetition units are arranged in an array form in the first region, multiple pixel repetition units are arranged in an array form in the second region, and a distribution density of the pixel repetition units in the first region is smaller than a distribution density of the pixel repetition units in the second region.

In a possible embodiment of the present disclosure, the four sub-pixels are distributed in three adjacent columns, the second sub-pixel and the third sub-pixel are located in different columns, and the two first sub-pixels are located in a same column between the second sub-pixel and the third sub-pixel.

In a possible embodiment of the present disclosure, the first sub-pixel is a green sub-pixel, the second sub-pixel is a red sub-pixel, and the third sub-pixel is a blue sub-pixel.

In a possible embodiment of the present disclosure, an area of the second sub-pixel is larger than an area of the first sub-pixel, and an area of the third sub-pixel is larger than the area of the first sub-pixel.

In a possible embodiment of the present disclosure, in the first region, pixel repetition units in one row of two adjacent rows and pixel repetition units in the other row of the two adjacent rows are positioned to be staggered relative to each other in the first direction.

In a possible embodiment of the present disclosure, in the second region, pixel repetition units in one row of two adjacent rows and pixel repetition units in the other row of the two adjacent rows are arranged in an alignment manner in the first direction.

In a possible embodiment of the present disclosure, in the first direction, a minimum spacing between two adjacent pixel repetition units in the first region is a first spacing, a minimum spacing between two adjacent pixel repetition units in the second region is a second spacing, and the first spacing is larger than the second spacing.

In a possible embodiment of the present disclosure, in the second direction, a minimum spacing between two adjacent pixel repetition units in the first region is a third spacing, a minimum spacing between two adjacent pixel repetition units in the second region is a fourth spacing, the third spacing is larger than or equal to the fourth spacing, and the second direction is perpendicular to the first direction.

In a possible embodiment of the present disclosure, in the first direction, a minimum spacing between any one of the pixel repetition units in the second region and another pixel repetition unit separated from any one of the pixel repetition units by n pixel repetition units is the third spacing, the first spacing is equal to the third spacing, and n is a positive integer larger than or equal to 1.

In a possible embodiment of the present disclosure, n is equal to 1.

In a possible embodiment of the present disclosure, two adjacent pixel repetition units in the first region are spaced apart from each other at four columns of sub-pixels in the first direction, two adjacent pixel repetition units in the first region located in a same column are spaced apart from each other at a virtual pixel repetition unit in the second direction, the virtual pixel repetition unit does not emit light, and the second direction is perpendicular to the first direction.

In a possible embodiment of the present disclosure, adjacent two pixel repetition units in the second region share one second sub-pixel or one third sub-pixel in the first direction.

In a possible embodiment of the present disclosure, in the second region, sub-pixels in each row form a plurality of pixel groups, each pixel group includes two green sub-pixels located in a same column, one blue sub-pixel and one red sub-pixel, the two green sub-pixels, the one blue sub-pixel and the one red sub-pixel are located in three adjacent columns, the pixel groups in two adjacent rows are staggered relative to each other by one column of sub-pixels, where one green sub-pixel in one row, one blue sub-pixel and one red sub-pixel that are in an adjacent row form one pixel.

In a possible embodiment of the present disclosure, two green sub-pixels in the repetition unit in the first region are each of a pentagon shape, and a maximum distance of the two green sub-pixels in the second direction is a distance between two edges of the two green sub-pixels respectively parallel to the first direction.

A high-precision metal mask for manufacturing the above-mentioned display substrate is further provided, including: a plurality of opening regions each corresponding to a shape and a position of the first sub-pixel, the second sub-pixel or the third sub-pixel.

A display device is further provided, including the above-mentioned display substrate.

A display driving method for performing display driving on the above-mentioned display substrate is further provided. When one first sub-pixel, one second sub-pixel and one third sub-pixel of the four sub-pixels are energized, one pixel is energized; the display driving method includes: determining a position of each pixel to be energized and the number of pixels to be energized; and determining a data signal corresponding to the pixel to be energized according to the position of the pixel to be energized, and energizing the pixel to be energized.

In a possible embodiment of the present disclosure, the determining a data signal corresponding to the pixel to be energized according to the position of the pixel to be energized, includes: acquiring brightness information about eight pixels surrounding the pixel to be energized; where the pixel to be energized is located in the first region; performing a weighting operation on the brightness information about the eight pixels surrounding the pixel to be energized to acquire an ideal brightness value of the pixel to be energized, and determining the data signal according to the ideal brightness value.

In a possible embodiment of the present disclosure, the performing a weighting operation on the brightness information about the eight pixels surrounding the pixel to be energized to acquire an ideal brightness value of the pixel to be energized, includes: performing the weighting operation on the brightness information about the eight pixels surrounding the pixel to be energized according to the following formula to acquire the ideal brightness value of the pixel to be energized, $$I(i,j) = \left[ 4*\left(\frac{1}{4}*I_0(i,j)^{gamma} + \frac{3}{32}*I_0(i,j-1)^{gamma} + \frac{3}{32}*I_0(i,j+1)^{gamma} + \frac{3}{32}*I_0(i-1,j)^{gamma} + \frac{3}{32}*I_0(i-1,j-1)^{gamma} + \frac{3}{32}*I_0(i-1,j+1)^{gamma} + \frac{3}{32}*I_0(i+1,j)^{gamma} + \frac{3}{32}*I_0(i+1,j-1)^{gamma} + \frac{3}{32}*I_0(i+1,j+1)^{gamma} \right) \right]^{1/gamma}$$

where I represents the data signal of the pixel to be energized, the pixel to be energized is an pixel in an i-th row and a j-th column of the display substrate, and i and j are each an integer.

DETAILED DESCRIPTION

In order to make the objects, the technical solutions and the advantages of the present disclosure more apparent, the present disclosure will be described hereinafter in a clear manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

Before describing the display substrate, the high-precision metal mask, the display device and the display driving method according to the embodiments of the present disclosure in detail, it is necessary to describe the related art as follows.

In the related art, when a front camera is included, many full screen display products each have an under-screen camera. In this way, Pixels Per Inch (PPI) of a pixel arrangement in a camera transparent region is reduced, so as to increase a transmittance and provide a better imaging quality in the camera transparent region while providing a display function. However, there are still too many pixels in the camera transparent region, the transmittance of the transparent region is affected adversely, resulting in poor quality of a picture captured by the camera. Further, when the number of pixels is reduced blindly, an abnormal display may easily occur in the transparent region, and a usage experience may be affected adversely.

Figure 1:
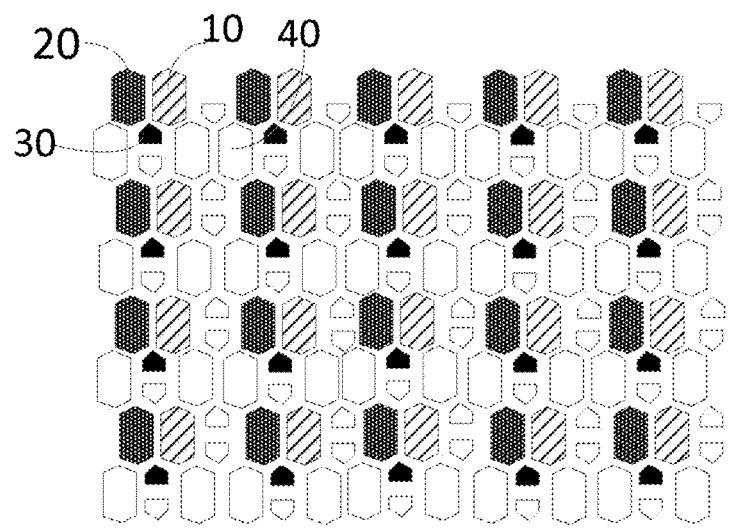
FIG. 1 is a schematic diagram illustrating a pixel arrangement structure of a transparent region of a display substrate in the related art.

FIG. 1 illustrates a pixel arrangement structure in the related art.

As shown in FIG. 1, in the related art, in a full screen display product, a plurality of pixel repetition units are arranged in a transparent region where an under-screen camera is located, and each pixel repetition unit includes one red sub-pixel 10, one blue sub-pixel 20 and one green sub-pixel 30. That is, an RGB pixel arrangement mode is adopted. A mode in which one pixel is energized among four pixels is adopted in the transparent region, and each pixel in a pixel Subpixel Rendering (SPR) mode is real. Thus, since there are too many sub-pixels in the transparent region, the transmittance of the transparent region is affected adversely by the sub-pixels, thereby to provide not so good imaging quality. In addition, in the RGB pixel arrangement mode, when a Gamma value is adjusted, it is necessary to provide two Gamma values corresponding to the transparent region and the display region respectively. That is, it is necessary to adjust two Gamma values, leading to a storage space occupation.

In view of the above-mentioned problems, a pixel display substrate, a high-precision metal mask, a display device and a display driving method are provided in the embodiments of the present disclosure, so as to effectively reduce the number of energized sub-pixels in the transparent region and increase the transmittance of the transparent region while ensuring the display effect.

Figure 2:
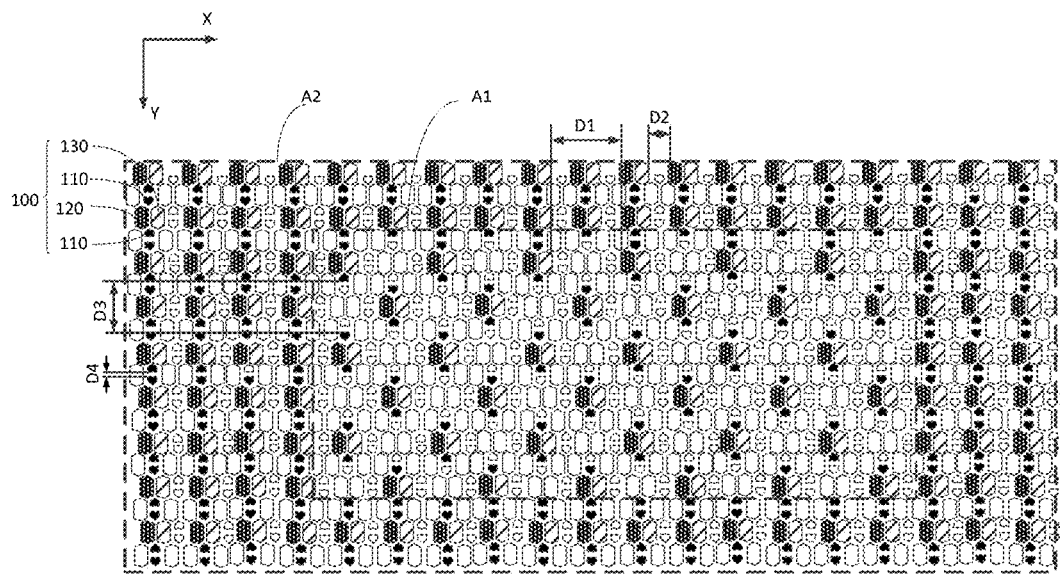
FIG. 2 is a schematic diagram illustrating a pixel arrangement structure of a display substrate according to an exemplary embodiment of the present disclosure.

As shown in FIG. 2, a display substrate is provided, including a display region. The display region includes a first region A1 and a second region A2 surrounding the first region A1, and an optical element is provided at a non-display side of the first region A1. A plurality of pixel repetition units 100 is included in the display region, each pixel repetition unit 100 includes four sub-pixels distributed in three adjacent rows and including two first sub-pixels 110, one second sub-pixel 120 and one third sub-pixel 130, one of the two first sub-pixels 110 is located in a first row and the other of the two first sub-pixels 110 is located in a third row, the second sub-pixel 120 and the third sub-pixel 130 are arranged in a same row, and are located in a second row between the first row and the third row, and the first row, the second row and the third row each extend in a first direction and are arranged in a second direction crossing the first direction. The first sub-pixel 110 in the first row, the second sub-pixel 120 and the third sub-pixel 130 in the second row form one pixel capable of emitting white light, and the first sub-pixel 110 in the third row, the second sub-pixel 120 and the third sub-pixel 130 in the second row form another pixel capable of emitting white light. Multiple pixel repetition units 100 are arranged in an array form in the first region A1, multiple pixel repetition units 100 are arranged in an array form in the second region A2, and a distribution density of the pixel repetition units 100 in the first region A1 is smaller than a distribution density of the pixel repetition units 100 in the second region A2.

In the display substrate, the high-precision metal mask, the display device and the display driving method according to the embodiments of the present disclosure, a pixel arrangement mode and a SPR algorithm of a transparent region are optimized, so as to effectively reduce the number of energized sub-pixels in the transparent region, reduce the number of Gamma values to be adjusted, save the storage space, and ensure the display effect by improving display data brightness values in the transparent region.

According to a display theory, the human eye is most sensitive to a green (G) color and less sensitive to a red (R) color and a blue (B) color. Therefore, in order to increase the transmittance of the transparent region to a greater extent while ensuring the display effect, in some embodiments, the first sub-pixel 110 is a green sub-pixel, the second sub-pixel 120 is a red sub-pixel 10, and the third sub-pixel 130 is a blue sub-pixel. A pixel arrangement mode in the display substrate of the embodiment of the present disclosure is described in detail below by taking a case where the first sub-pixel 110 is the green sub-pixel, the second sub-pixel 120 is the red sub-pixel, and the third sub-pixel 130 is the blue sub-pixel as an example.

In the display substrate of the embodiments of the present disclosure, the optical element is provided on the non-display side of the first region A1, that is, the first region A1 is the transparent region. For example, the optical element provided on the non-display side of the first region A1 is a camera assembly, and the first region A1 is a transparent region where an under-screen camera is located, so as to realize the arrangement of the under-screen camera. Accordingly, the second region A2 is a normal display region other than the first region A1 in the display region.

It should be appreciated that, the optical element is not limited to the camera assembly, but may be another optical element that requires the display region to be the transparent region, which will not be particularly defined herein.

Hereinafter, for convenience of description, the first region A1 is referred to as the transparent region, and the second region A2 is referred to as the normal display region. In the display substrate of the embodiment of the present disclosure, the pixel arrangement mode in the normal display region and the transparent region is as follows.

As shown in FIG. 2, multiple pixel repetition units 100 are arranged in both the normal display region and the transparent region. Each pixel repetition unit 100 includes four sub-pixels distributed in three adjacent rows, and the four sub-pixels include two first sub-pixels 110, one second sub-pixel 120 and one third sub-pixel 130. One of the two first sub-pixels 110 is located in the first row and the other of the two first sub-pixels 110 is located in the third row. The second sub-pixel 120 and the third sub-pixel 130 are arranged in the same row and located in the second row between the first row and the third row. The first row, the second row and the third row each extend in the first direction and are arranged in the second direction crossing the first direction. The first sub-pixel 110 in the first row, the second sub-pixel 120 and the third sub-pixel 130 in the second row form one pixel, and the first sub-pixel 110 of the third row, the second sub-pixel 120 and the third sub-pixel 130 in the second row form another pixel.

That is, in order to reduce the number of pixels, the pixel repetition units 100 in the normal display region and the transparent region are each in a GGRB arrangement mode, and a Subpixel Rendering (SPR) of the pixels is performed by adopting a color borrowing mode, where the G sub-pixel (the first sub-pixel 110) is real, the R sub-pixel (the second sub-pixel 120) and the B sub-pixel (the third sub-pixel 130) sub-pixels are shared by two pixels in two adjacent rows. When a white point is energized, three sub-pixels including the R sub-pixel, the G sub-pixel and the B sub-pixel are energized, so as to achieve a mode in which two pixels are energized among eight pixels in the pixel arrangement mode while increasing the transmittance of the transparent region and improve the brightness value of the transparent region.

Since the human eye is less sensitive to blue, when pixels in an entire screen is energized, three bright spots are formed, where a brightness value of one bright spot formed by the R sub-pixels is 30%, a brightness value of one bright spot formed by the upper G sub-pixels is 32.5%, and a brightness value of one bright spot formed by the lower G sub-pixels is 32.5%. The G sub-pixels in the pixel arrangement mode is distributed evenly as compared with that the pixel repetition units 100 are arranged in the RGB pixel arrangement mode in the related art. In addition, as compared with a solution where one pixel is energized among four pixels, and six sub-pixels are energized among eight pixels in the related art, only four sub-pixels are energized among eight pixels in the pixel arrangement mode of the display substrate in the embodiment of the present disclosure, so it is able to reduce the number of sub-pixels greatly while keeping information about pixels.

In addition, since a sub-pixel ratio of a real R sub-pixel to a real G sub-pixel to a real B sub-pixel in the related art is R:G:b=1:1:1, when adjusting the Gamma value, it is necessary to adjust two Gamma values, leading to a storage space occupation. In the embodiment of the present disclosure, since the pixel arrangements of the transparent region and the normal display region are the same, only one Gamma value needs to be adjusted, so that the storage space is saved.

In addition, as shown in FIG. 2, in some exemplary embodiments of the present disclosure, the four sub-pixels are distributed in three adjacent columns, the second sub-pixel 120 and the third sub-pixel 130 are located in different columns, and the two first sub-pixels 110 are located in the same column between the second sub-pixel 120 and the third sub-pixel 130.

In a specific implementation, sub-pixels of different colors each generally have a different service life, and an area of each sub-pixel may be set according to the service life of the sub-pixel. Generally, an area of a sub-pixel having a lowest service life is set as a largest value. Since a service life of the blue sub-pixel is the lowest in a current organic light-emitting material, optionally, in a pixel arrangement structure of the embodiment of the present disclosure, an area of the blue sub-pixel is larger than an area of the green sub-pixel and an area of the red sub-pixel.

Specifically, in the pixel arrangement structure of the embodiment of the present disclosure, an area of the second sub-pixel 120 is larger than an area of the first sub-pixel 110, and an area of the third sub-pixel 130 is larger than the area of the first sub-pixel 110.

It should be appreciated that, in the pixel arrangement structure of the embodiment of the present disclosure, shapes of the two first sub-pixels 110 in the pixel repetition unit 100 may be, but not limited to, the same or different.

In addition, in some exemplary embodiments of the present disclosure, as shown in FIG. 2, in the first region A1, pixel repetition units 100 in one row of two adjacent rows and pixel repetition units 100 in the other row of the two adjacent rows are positioned to be staggered relative to each other in the first direction.

Specifically, in two adjacent rows of pixel repetition units 100 in the first region A1, each pixel repetition unit 100 in one row of pixel repetition units is in a different column from each pixel repetition unit 100 in the other row of pixel repetition units, so as to form a staggered arrangement mode.

In the second region A2, pixel repetition units 100 in one row of two adjacent rows and pixel repetition units 100 in the other row of the two adjacent rows are arranged in an alignment manner in the first direction.

Specifically, in two adjacent rows of pixel repetition units 100 in the second region A2, each pixel repetition unit 100 in one row of pixel repetition units is in a same column as each pixel repetition unit 100 in the other row of pixel repetition units.

In a specific and exemplary embodiment, the first direction may be a row direction X and the second direction may be a column direction Y.

In the row direction X, a minimum spacing between two adjacent pixel repetition units 100 in the first region A1 is a first spacing D1, a minimum spacing between two adjacent pixel repetition units 100 in the second region A2 is a second spacing D2, and the first spacing D1 is larger than the second spacing D2.

In the column direction Y perpendicular to the row direction X, a minimum spacing between two adjacent pixel repetition units 100 in the first region A1 is a third spacing D3, a minimum spacing between two adjacent pixel repetition units 100 in the second region A2 is a fourth spacing D4, and the third spacing D3 is larger than or equal to the fourth spacing D4.

For example, in the row direction X, a minimum spacing between any one of the pixel repetition units 100 in the second region A2 and another pixel repetition unit 100 separated from the any one of the pixel repetition units 100 by n pixel repetition units is the third spacing D3, the first spacing D1 is equal to the third spacing D3, and n is a positive integer larger than or equal to 1.

In one exemplary embodiment, n is equal to 1. It should be appreciated that a value of n may be another value in practice applications.

In some embodiments, adjacent two pixel repetition units in the second region share one second sub-pixel or one third sub-pixel in the row direction.

Figure 3:
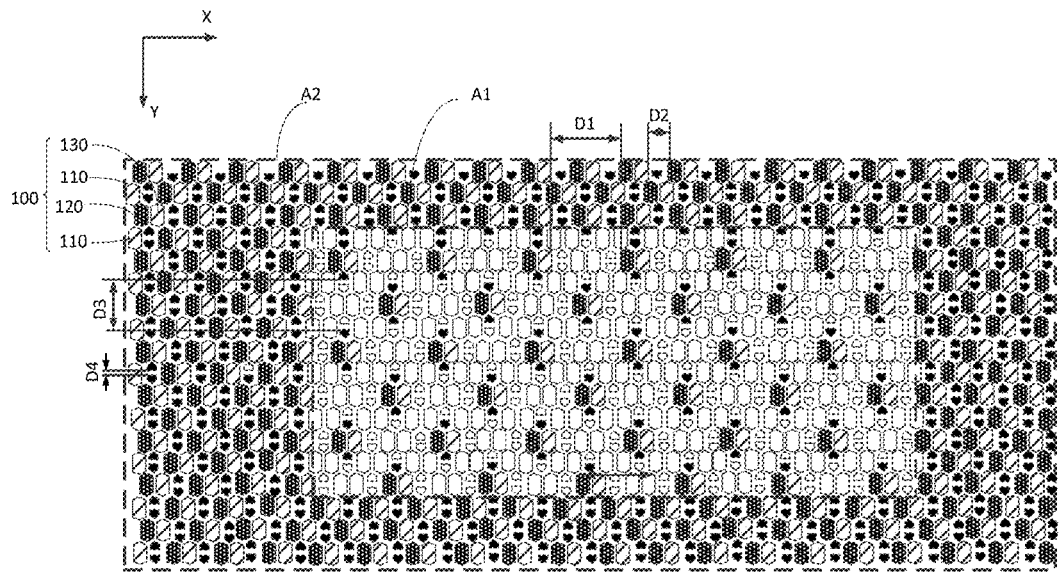
FIG. 3 is a schematic diagram illustrating a pixel arrangement structure of the display substrate according to an exemplary embodiment of the present disclosure.

As shown in FIG. 3, two adjacent pixel repetition units in the second region A2 share one second sub-pixel or one third sub-pixel in the row direction. For example, two adjacent pixel repetition units in the second region A2 share one blue sub-pixel or one green sub-pixel in the row direction.

In some embodiments, in the normal display region, sub-pixels in each row form a plurality of pixel groups, each pixel group includes two green sub-pixels located in a same column, one blue sub-pixel and one red sub-pixel, the two green sub-pixels, the one blue sub-pixel and the one red sub-pixel are located in three adjacent columns, the pixel groups in two adjacent rows are staggered relative to each other by one column of sub-pixels, where one green sub-pixel in one row, one blue sub-pixel and one red sub-pixel that are in an adjacent row form one pixel.

In some embodiments, two adjacent pixel repetition units in the transparent region are spaced apart from each other at four columns of sub-pixels in the row direction, two adjacent pixel repetition units in the transparent region are spaced apart from each other at a virtual pixel repetition unit in the column direction, and the virtual pixel repetition unit does not emit light.

In some embodiments, two green sub-pixels in the repetition unit in the first region are each of a pentagon shape, and a maximum distance of the two green sub-pixels in the second direction is a distance between two edges of the two green sub-pixels respectively parallel to the first direction.

In addition, a high-precision metal mask for manufacturing the display substrate in the embodiments of the present disclosure is further provided, including: a plurality of opening regions each corresponding to a shape and a position of the first sub-pixel 110, the second sub-pixel 120 or the third sub-pixel 130.

In addition, a display device including the display substrate in the embodiments of the present disclosure is further provided.

In addition, a display driving method for performing display driving on the display substrate in the embodiments of the present disclosure is further provided. When one first sub-pixel 110, one second sub-pixel 120 and one third sub-pixel 130 of the four sub-pixels are energized, one pixel is energized. The display driving method includes determining a position of each pixel to be energized and the number of pixels 100a to be energized, and determining a data signal corresponding to the pixel 100a to be energized according to the position of the pixel 100a to be energized, and energizing the pixel 100a to be energized.

Figure 4:
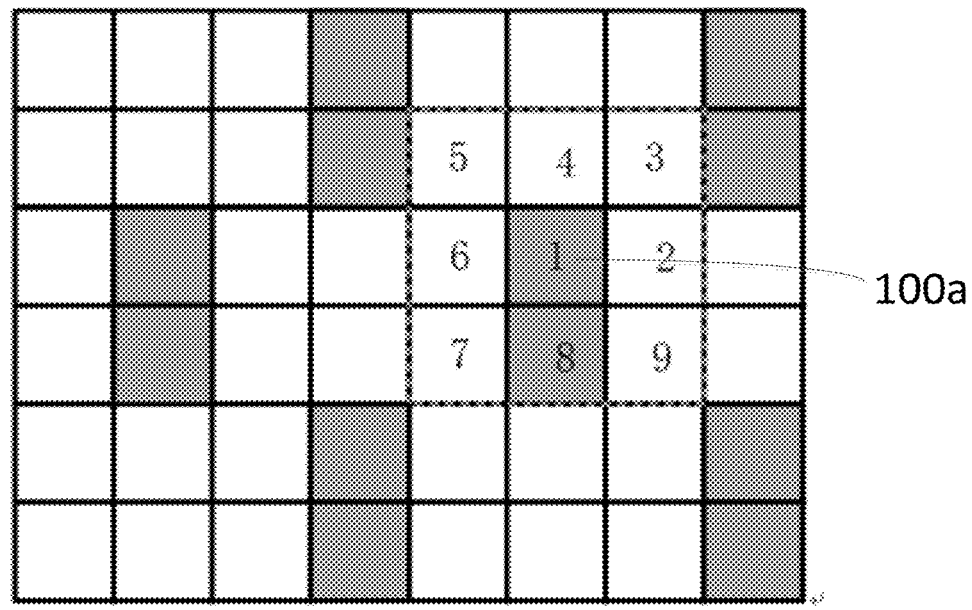
FIG. 4 is a schematic diagram illustrating a pixel Subpixel Rendering (SPR) algorithm description in the display substrate according to an exemplary embodiment of the present disclosure.

In a possible embodiment of the present disclosure, the determining a data signal corresponding to the pixel to be energized according to the position of the pixel to be energized specifically includes: acquiring brightness information about eight pixels (i.e., pixels corresponding to 2 to 9 respectively shown in FIG. 4) surrounding the pixel to be energized; where the pixel to be energized is located in the first region; and performing a weighting operation on the brightness information about the eight pixels surrounding the pixel to be energized to acquire an ideal brightness value of the pixel to be energized, and determining the data signal according to the ideal brightness value.

In a possible embodiment of the present disclosure, the performing a weighting operation on the brightness information about the eight pixels surrounding the pixel to be energized to acquire an ideal brightness value of the pixel to be energized, includes: performing the weighting operation on the brightness information about the eight pixels surrounding the pixel to be energized according to the following formula to acquire the ideal brightness value of the pixel to be energized, $$I(i, j) = \left[4 * \left(\frac{1}{4} * I_0(i, j)^{gamma} + \right.\right.$$
$$\frac{3}{32} * I_0(i, j-1)^{gamma} + \frac{3}{32} * I_0(i, j+1)^{gamma} +$$
$$\frac{3}{32} * I_0(i-1, j)^{gamma} + \frac{3}{32} * I_0(i-1, j-1)^{gamma} +$$
$$\frac{3}{32} * I_0(i-1, j+1)^{gamma} + \frac{3}{32} * I_0(i+1, j)^{gamma} +$$
$$\left.\left.\frac{3}{32} * I_0(i+1, j-1)^{gamma} + \frac{3}{32} * I_0(i+1, j+1)^{gamma}\right)\right]^{1/gamma}$$

where I represents the data signal (such a data signal as a voltage signal or a current signal) of the pixel 100a to be energized, the pixel 100a to be energized is an pixel in an i-th row and a j-th column of the display substrate, and i and j are each an integer.

In the above scheme, the SPR algorithm in the transparent region is optimized as follows in combination with the pixel arrangement mode of the transparent region and the normal display region.

In order to reduce a difference between the transparent region and the normal display region due to too few pixels in the transparent region, when designing the SPR algorithm, the brightness information about eight pixels surrounding each pixel is included in the pixel when the pixel is energized. As shown in the FIG. 4, brightness information about one pixel of the eight pixels at a corresponding position accounts for ¼, and brightness information about another pixel of the eight pixels at a corresponding position accounts for 3/32. In order to reduce a brightness value difference between the transparent region and the normal display region, four times of a brightness value of each pixel may be provided in the transparent region when each brightness value in the entire transparent region is smaller than a 64 gray-level.

When an actual display substrate is tested, after the SPR algorithm has been performed on the display substrate, the brightness value of the transparent region has been significantly improved, and both a natural image and an engineering image may be normally displayed on the display device including the display substrate.

In the display substrate, the high-precision metal mask, the display device and the display driving method in the embodiments of the present disclosure, the pixel arrangement mode and the SPR algorithm (the SPR algorithm is performed by using the weighted pixel data of surrounding eight pixels, so to ensure the display effect of the transparent region) are optimized, so as to, as compared with the pixel arrangement mode (the mode where one pixel is energized among four pixels) in the related art, effectively reduce the number of sub-pixels, reduce the number of Gamma values to be adjusted, save the storage space, reserve the same number of energized pixels, and ensure the display effect by improving the display data brightness values in the transparent region.

Some descriptions will be given as follows.

(1) The drawings merely relate to structures involved in the embodiments of the present disclosure, and the other structures may refer to those known in the art.

(2) For clarification, in the drawings for describing the embodiments of the present disclosure, a thickness of a layer or region is zoomed out or in, i.e., these drawings are not provided in accordance with an actual scale. It should be appreciated that, in the case that such an element as layer, film, region or substrate is arranged "on" or "under" another element, it may be directly arranged "on" or "under" the other element, or an intermediate element may be arranged therebetween.

(3) In the case of no conflict, the embodiments of the present disclosure and the features therein may be combined to acquire new embodiments.

The above embodiments are merely for illustrative purposes, but shall not be construed as limiting the scope of the present disclosure. The scope of the present disclosure shall be subject to the scope defined by the appended claims.

What is claimed is:

1. A display substrate comprising a display region, wherein the display region comprises a first region and a second region surrounding the first region, an optical element is provided at a non-display side of the first region;
   a plurality of pixel repetition units is comprised in the display region, each pixel repetition unit comprises four sub-pixels distributed in three adjacent rows and comprising two first sub-pixels, one second sub-pixel and one third sub-pixel, one of the two first sub-pixels is located in a first row and the other of the two first sub-pixels is located in a third row, the second sub-pixel and the third sub-pixel are arranged in a same row, and are located in a second row between the first row and the third row, and the first row, the second row and the third row each extend in a first direction and are arranged in a second direction crossing the first direction;
   the first sub-pixel in the first row, the second sub-pixel and the third sub-pixel in the second row form one pixel capable of emitting white light, and the first sub-pixel in the third row, the second sub-pixel and the third sub-pixel in the second row form another pixel capable of emitting white light;
   wherein multiple pixel repetition units are arranged in an array form in the first region, multiple pixel repetition units are arranged in an array form in the second region, and a distribution density of the pixel repetition units in the first region is smaller than a distribution density of the pixel repetition units in the second region.

2. The display device according to claim 1, wherein the four sub-pixels are distributed in three adjacent columns, the second sub-pixel and the third sub-pixel are located in different columns, and the two first sub-pixels are located in a same column between the second sub-pixel and the third sub-pixel.

3. The display device according to claim 1, wherein the first sub-pixel is a green sub-pixel, the second sub-pixel is a red sub-pixel, and the third sub-pixel is a blue sub-pixel.

4. The display device according to claim 1, wherein an area of the second sub-pixel is larger than an area of the first sub-pixel, and an area of the third sub-pixel is larger than the area of the first sub-pixel.

5. The display device according to claim 1, wherein, in the first region, pixel repetition units in one row of two adjacent rows and pixel repetition units in the other row of the two adjacent rows are positioned to be staggered relative to each other in the first direction.

6. The display device according to claim 1, wherein, in the second region, pixel repetition units in one row of two adjacent rows and pixel repetition units in the other row of the two adjacent rows are arranged in an alignment manner in the first direction.

7. The display device according to claim 1, wherein, in the first direction, a minimum spacing between two adjacent pixel repetition units in the first region is a first spacing, a minimum spacing between two adjacent pixel repetition units in the second region is a second spacing, and the first spacing is larger than the second spacing.

8. The display device according to claim 7, wherein, in the second direction, a minimum spacing between two adjacent pixel repetition units in the first region is a third spacing, a minimum spacing between two adjacent pixel repetition units in the second region is a fourth spacing, the third spacing is larger than or equal to the fourth spacing, and the second direction is perpendicular to the first direction.

9. The display device according to claim 8, wherein, in the first direction, a minimum spacing between any one of the pixel repetition units in the second region and another pixel repetition unit separated from the any one of the pixel repetition units by n pixel repetition units is the third spacing, the first spacing is equal to the third spacing, and n is a positive integer larger than or equal to 1.

10. The display device according to claim 9, wherein n is equal to 1.

11. The display substrate according to claim 1, wherein two adjacent pixel repetition units in the first region are spaced apart from each other at four columns of sub-pixels in the first direction, two adjacent pixel repetition units in the first region located in a same column are spaced apart from each other at a virtual pixel repetition unit in the second direction, the virtual pixel repetition unit does not emit light, and the second direction is perpendicular to the first direction.

12. The display substrate according to claim 1, wherein adjacent two pixel repetition units in the second region share one second sub-pixel or one third sub-pixel in the first direction.

13. The display substrate according to claim 1, wherein in the second region, sub-pixels in each row form a plurality of pixel groups, each pixel group comprises two green sub-pixels located in a same column, one blue sub-pixel and one red sub-pixel, the two green sub-pixels, the one blue sub-pixel and the one red sub-pixel are located in three adjacent columns, the pixel groups in two adjacent rows are staggered relative to each other by one column of sub-pixels, wherein one green sub-pixel in one row, one blue sub-pixel and one red sub-pixel that are in an adjacent row form one pixel.

14. The display substrate according to claim 1, wherein two green sub-pixels in the repetition unit in the first region are each of a pentagon shape, and a maximum distance of the two green sub-pixels in the second direction is a distance between two edges of the two green sub-pixels respectively parallel to the first direction.

15. A high-precision metal mask for manufacturing the display substrate according to claim 1, comprising: a plurality of opening regions each corresponding to a shape and a position of the first sub-pixel, the second sub-pixel or the third sub-pixel.

16. A display device, comprising the display substrate according to claim 1.

17. A display driving method for performing display driving on the display substrate according to claim 1, wherein when one first sub-pixel, one second sub-pixel and one third sub-pixel of the four sub-pixels are energized, one pixel is energized; the display driving method comprises:
determining a position of each pixel to be energized and the number of pixels to be energized; and
determining a data signal corresponding to the pixel to be energized according to the position of the pixel to be energized, and energizing the pixel to be energized.

18. The display driving method according to claim 17, wherein the determining a data signal corresponding to the pixel to be energized according to the position of the pixel to be energized, comprises:
acquiring brightness information about eight pixels surrounding the pixel to be energized; wherein the pixel to be energized is located in the first region; and
performing a weighting operation on the brightness information about the eight pixels surrounding the pixel to be energized to acquire an ideal brightness value of the pixel to be energized, and determining the data signal according to the ideal brightness value.

19. The display driving method according to claim 18, wherein the performing a weighting operation on the brightness information about the eight pixels surrounding the pixel to be energized to acquire an ideal brightness value of the pixel to be energized, comprises: performing the weighting operation on the brightness information about the eight pixels surrounding the pixel to be energized according to the following formula to acquire the ideal brightness value of the pixel to be energized, $$I(i,j) = \left[4*\left(\frac{1}{4}*I_0(i,j)^{gamma} + \frac{3}{32}*I_0(i,j-1)^{gamma} + \frac{3}{32}*I_0(i,j+1)^{gamma} + \frac{3}{32}*I_0(i-1,j)^{gamma} + \frac{3}{32}*I_0(i-1,j-1)^{gamma} + \frac{3}{32}*I_0(i-1,j+1)^{gamma} + \frac{3}{32}*I_0(i+1,j)^{gamma} + \frac{3}{32}*I_0(i+1,j-1)^{gamma} + \frac{3}{32}*I_0(i+1,j+1)^{gamma}\right)\right]^{1/gamma}$$

wherein I represents the data signal of the pixel to be energized, the pixel to be energized is an pixel in an i-th row and a j-th column of the display substrate, and i and j are each an integer.

20. The display driving method according to claim 17, wherein two adjacent pixel repetition units in the first region are spaced apart from each other at four columns of sub-pixels in the first direction, two adjacent pixel repetition units in the first region located in a same column are spaced apart from each other at a virtual pixel repetition unit in the second direction, and the virtual pixel repetition unit does not emit light.

* * * * *